United States Patent
Ellington, IV

[11] 4,004,726
[45] Jan. 25, 1977

[54] BONDING OF LEADS

[75] Inventor: Thomas S. Ellington, IV, Bethlehem, Pa.

[73] Assignee: Western Electric Company, Inc., New York, N.Y.

[22] Filed: Dec. 23, 1974

[21] Appl. No.: 535,600

[52] U.S. Cl. .............................. 228/173; 228/179; 228/180 A; 174/68.5

[51] Int. Cl.² ...................... H05K 1/10; H05K 3/32

[58] Field of Search ......... 29/475, 203 MW, 203 S, 29/628, 630 R, 630 A, 625, 626; 228/141, 164, 173, 179, 180 A, 106, 5.5; 219/94; 52/758 D; 174/68.5

[56] References Cited
UNITED STATES PATENTS

| | | | |
|---|---|---|---|
| 973,586 | 10/1910 | Thomson | 219/94 |
| 1,125,070 | 1/1915 | Daviee | 52/758 D X |
| 1,682,403 | 8/1928 | Murray | 228/139 X |
| 3,380,155 | 4/1968 | Burks | 228/180 A X |
| 3,403,438 | 10/1968 | Best et al. | 228/180 A X |
| 3,588,618 | 6/1971 | Otte | 29/626 X |
| 3,590,056 | 8/1971 | Clark | 228/180 A X |

OTHER PUBLICATIONS

Western Electric Technical Digest, No. 38, Apr. 1975, pp. 13–14.

*Primary Examiner*—Al Lawrence Smith
*Assistant Examiner*—K. J. Ramsey
*Attorney, Agent, or Firm*—W. O. Schellin

[57] ABSTRACT

Leads are bonded to a substrate by interposing between the substrate and the leads a conductor portion having substantially the same thickness as the thickness of the leads. In the preferred embodiment, the conductor portion is an end portion of the lead which is folded back on the lead and which is brought into contact with the substrate for bonding.

3 Claims, 5 Drawing Figures

BONDING OF LEADS

BACKGROUND OF THE INVENTION

1. Field of the Invention

The present invention relates broadly to bonding one article to another. More particularly, the invention relates to bonding of leads to substrates, for example, in the manufacture of integrated circuits wherein lead frames are bonded to metallized patterns on ceramic substrates.

2. Description of the Prior Art

In the manufacture of integrated circuits one assembly method includes bonding semiconductor chips to ceramic substrates. Such substrates typically have conductive "sunburst" patterns on one side thereof. The semiconductor chips or devices are usually bonded to centers of the sunburst patterns while a plurality of leads, held in position by what is commonly referred to in the industry as a lead frame, are bonded to outer terminations of these sunburst patterns. After the leads have been bonded to the substrates, the resulting product is usually further processed as, for instance, by molding protective covers over the substrates. Also, at some time after the bonding operation, the leads of the lead frames are cut to form the individual leads. The leads may then also be bent or formed for certain types of integrated circuit packages.

The resulting circuit packages are used in various combinations inserted and soldered into printed circuit boards, where such packages serve as basic electronic building blocks for a variety of electronic systems. In some applications, special package connectors permit the packages to be removably inserted where the packages are not soldered, into the boards. In either case, the insertion of the circuit packages directly into printed circuit boards, or into connectors, subjects the bonded leads to stresses. In addition to such insertion stresses, the leads are subjected to stresses through gradual warping of circuit boards or through thermal expansion and contraction of the leads and the boards or connectors. In the past, it has been a problem to insure that the bonds of the leads to the substrates are consistently of a sufficient strength to withstand such stresses.

SUMMARY OF THE INVENTION

It is, therefore, an object of the invention to improve the strength of adhesion between two bonded articles.

It is a further object of the invention to overcome problems in consistently obtaining bonds of acceptable strength between substrates and leads extending therefrom.

According to one aspect of the invention, a method of joining a first article to a second article where the first article has an end portion formed over onto itself includes positioning the formed-over end portion of the first article against the second article, and bonding the formed-over portion of the first article to the second article.

According to another aspect of the invention, a method includes bonding a conductive member, having two opposed bond areas thereon, with one area to a substrate, and bonding a lead to the other bond area of the member.

Furthermore, an article, according to an aspect of the invention, includes a first element having a bond supporting surface and at least one second element adjacent the surface and extending therefrom, such second element having a formed end portion bonded to the surface.

BRIEF DESCRIPTION OF THE DRAWING

A particular embodiment of the invention is best described in reference to the accompanying drawing, wherein.

DETAILED DESCRIPTION

Figure 1:
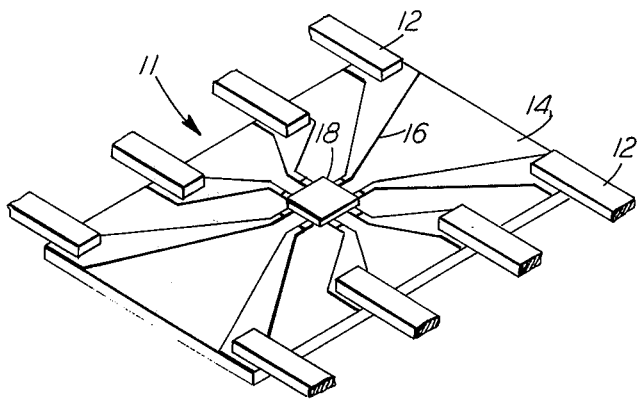
FIG. 1 is a typical product according to the prior art.

Referring now to FIG. 1, there is shown a device, designated generally by the numeral 11, which is representative of the prior art and which depicts the manner in which a plurality of external leads 12 are bonded to a substrate 14. The substrate 14 has a metallized pattern 16 which interconnects a semiconductor chip 18 with the leads 12. For purposes of discussion, the chip 18 is shown and described as a beam-lead chip. However, the present invention is not limited to a beam-lead chip. The present invention distinguishes over the prior art leads 12 and the manner in which they are attached to the substrate 14. Accordingly, the invention also applies, for example, to a device 11 where the chip 18 is beamless and where wire is bonded to the pattern 16 on a substrate.

Typically, the prior art leads 12 extend into overlapping contact with the metallized pattern 16 on the substrate 14. The leads 12 are bonded in overlapping relationship directly to the metallized pattern 16, such that lower surfaces 19 of the leads 12 are in direct contact with the metallized pattern.

However, in the prior art, articles or leads 12 to be bonded are not always of uniform thickness or nonvarying cross section. In resistance welding one part to another, for instance, parts are embossed to have coined areas through which the weld or bond is formed.

With respect to beam-lead devices, U.S. Pat. No. 3,599,056 to Clark, assigned to Bell Laboratories, discloses a beam lead of nonuniform thickness. Thickened bond areas of leads extending from a chip, such as the chip 18 of FIG. 1, prevent excessive elongation of the leads as a result of compressive forces during bonding. Such elongation, as it may readily occur in leads of uniform thickness, tends to raise the chip 18 from the substrate 14. However, the known prior art does not address itself to improving the strength and particularly the peel strength between leads, such as the leads 12 of FIG. 1, and substrates, such as the substrate 14.

Figure 2:
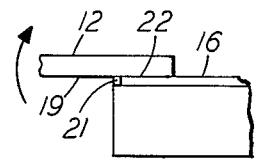
FIG. 2 is an enlarged view of a single lead of the prior-art product of FIG. 1.

Referring now to FIG. 2, an end view of the substrate 14 is shown with one of the leads 12 bonded to the metallized pattern 16 in accordance with the prior art. A slight indentation in the bond area of the leads which occurs in some methods of bonding, as for example, in thermocompression bonding, is not shown. As a bending moment is exerted on the lead 12 in the direction of the arrow, a stress concentration is found to exist at a forward boundary 21 of a bonded interface 22 between the lead 12 and the metallized pattern 16. It is at this forward boundary 21 where leads 12 tend to separate initially from the respective metallized pattern 16, ultimately, such a separation can result in a failure of the bond across the entire interface 22.

Figure 3:
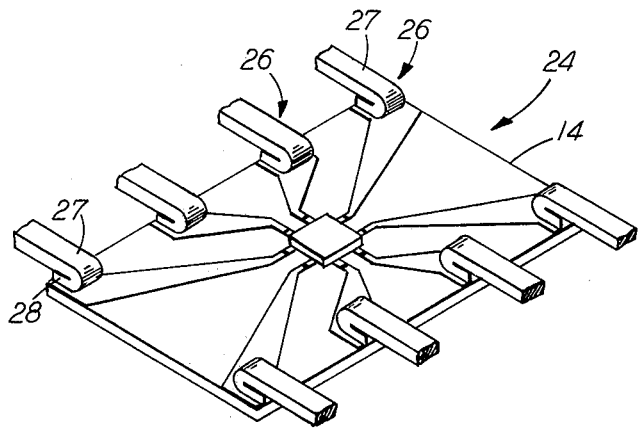
FIG. 3 is a circuit package as an embodiment of the present invention.

Referring now to FIG. 3, there is shown a device 24 which is distinguished over the prior art device 11 in FIG. 1 by having leads 26 bonded thereto in accordance with the present invention. Again, as in FIG. 1, slight depressions which are, for example, caused by forming some thermocompression bonds are not shown in the drawing. Body portions 27 of the leads 26 are not in direct contact with the substrate 14 because of intervening conductive members 28 which are interposed between the body portions 27 of the leads 26 and the metallized pattern 16 on the substrate 14.

Stress failures which occur in leads 12 bonded in accordance with the prior art are substantially reduced by bonding leads 26 in the manner as herein described. In testing leads 12 in a 90° peel test, it was discovered that the interposed member 28 tends to strengthen otherwise weak bonds.

Figure 4:
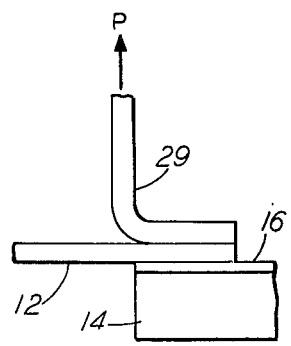
FIG. 4 is a side view of an arrangement for testing the peel strength on bonded leads.

For instance, in an experiment, a number of leads were tested for their 90° peel strength. In each instance, a second lead 29 was bonded in superposition to a first lead 12 which was itself bonded in accordance with prior art practices to one of the substrates 14. Four of the bond sites on the substrate 14 (in tests 1 through 4) were intentionally slightly smudged or contaminated to induce a known failure mechanism. All leads were then pulled in the 90° peel test and the force required to pull the leads was recorded. FIG. 4 shows the upper lead 29 being subjected to the pulling force P in the direction of the arrow. Ultimately the lower lead 12 was subjected to a similar test. Forces required to break the leads or bonds of the leads were recorded as follows:

| | Lead 29 (P in pounds) | Lead 12 (P in pounds) |
|---|---|---|
| 1 | 5.5 | 2.8 |
| 2 | 5.7 | 2.7 |
| 3 | 6.0 | 2.8 |
| 4 | 5.5 | 2.8 |
| 5 | 5.8 | 8.0 |
| 6 | 5.9 | 8.0 |
| 7 | 5.7 | 8.4 |
| 8 | 5.5 | 8.1 |

In the test on the leads 29 the above results were recorded upon failure of the leads by lead rupture. However, in tests on the leads 12, failure occurred in tests 1 through 4 by a failing bond between the leads 12 and the substrate 14. The results consequently indicate a typical reduction in the bond strength caused by slight contamination of the bond site on the substrate 14. The higher strength of the leads 12 in test 5 through 8 is attributed to lead portions of the leads 29 remaining bonded to the leads 12 to strengthen them in a critical section during the test.

The results above further indicate an advantage of the present invention. The peel tests of the upper leads 29 and of the corresponding lower leads 12 in each of the first four positions indicate that the weaker bond between the substrate 14 and the lower lead 12 is, at least to some extent, protected from forces applied to the upper lead 29. It is believed that the thickness of lower lead 12 distributes the stresses applied through the upper lead 29. The bond between the lower lead 12 and the substrate 14 is consequently subjected to a less severe stress concentration when the pull force is applied through the upper lead 29.

There are at least three basic known failure modes for bonds between a brittle substrate and a ductile metal, such as the substrate 14 and the lead 12. These failure modes are (a) a ceramic weakness which causes ceramic pullout, (b) a weakness in the metallization pattern 16 which causes either a separation within the pattern 16 or a separation of the pattern 16 from the substrate 14, and (c) a weak bond between the lead 12 and the metallization pattern 16 which is caused by improper bonding or the presence of contamination on the interface. These three basic failure modes can occur to some extent in any combination in a failing bond between the substrate 14 and the lead 12. On the other hand, bonds between two ductile bodies do not fail in all of these failure modes. In bonds of the leads 26 of FIGS. 3 and 5, made to the substrate 14 in accordance with the present invention, a substantial reduction in the number of unacceptably weak bonds over bonds made according to the prior art is experienced.

Figure 5:
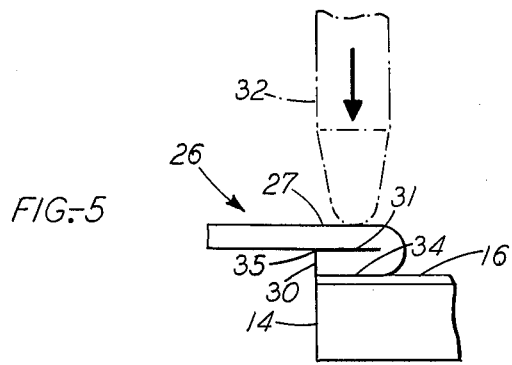
FIG. 5 is a side view of one of the leads in FIG. 3 bonded to the substrate.

In the preferred embodiment in FIGS. 3 and 5, the interposed members 28 are formed end portions or ends 30 of the leads 26. Folding the ends 30 of the leads 26 against the respective body portions 27 is a particular aspect of the present invention with several advantages: (1) the ends 30 are maintained in alignment with the body portions 27 of the leads 26, simplifying handling of the leads 26 and permitting bonding of the leads 26 to the ends 30 and of the ends 30 to the metallized pattern 16 of the substrate 14 in a single operation; (2) the facing surfaces of the body portions 27 and the ends 30 are protecting each other from contamination; and (3) the continuity between the body portions 27 and the respective ends 30 strengthen the junctions of the ends 30 to the body portions 27.

The leads 26 on integrated circuit packages similar to the one shown in FIG. 3, are typically ten thousandths of an inch thick and nominally twenty-five thousandths of an inch wide. Their widths vary between twenty and thirty thousandths of an inch. The folded portions 28 are preferably between thirty and sixty thousandths of an inch long, which is sufficient to establish bonds of desirable strength between the folded portions and the metallized pattern 16 of the substrate 14. The referred-to sizes are given for illustrative purposes only and are not critical.

FIG. 5 shows the substrate 14 in relation to one of the leads 26. The lead 26 is positioned with the folded end 30 facing the metallized pattern 16. When the lead 26 is bonded, the end 30 is interposed between the body portion 27 of the lead 26 and the substrate 14. Prior to bonding, the folded end 30 can be, but need not be, in intimate contact with the body portion 27 of the lead 26 over a total area of an interface 31 therebetween. However, in referring to FIG. 5, when the lead 26 becomes attached to the substrate 14 in a standard thermocompression bond, the pressure exerted by a thermode or tip 32 forces the body portion 27 into intimate contact with the folded end 30. Combined pressure and heat from the tip 32 forms a bond between the body portion 27 and the end 30. Simultaneously therewith, a bond is formed along an interface 34 between the end 30 and the metallized pattern 16 of the substrate 14.

When the lead 26, as bonded in accordance with the present invention, is subjected to a stress in the upward direction away from the substrate 14, the resulting bending stress is concentrated at a leading edge 35 of the interface 31 between the body portion 27 and the end 30 of the lead 26. It has been found that a bond on the interface 31 between these two thicknesses of the lead, the body portion 27 and the end 30, while it may not always be as strong as the strongest bonds of the leads made directly to substrates, is more consistently of acceptable strength than a bond, according to the prior art, of the lead 12 directly to the metallized pattern 16. In addition, the stress is distributed by the additional thickness of the end 30 of the lead material to act over a distributed area of a major portion of the interface 34 between the portion 28 and the metallized pattern 16. Consequently, as a result of interposing an additional thickness of the lead material, such as the folded end 30 between the body portion 27 of the lead and the metallized pattern 16, a stronger bond results, as compared to a similar bond made according to the prior art.

While the present invention has been described with respect to a specific embodiment shown in FIGS. 3 and 5, a number of changes can be made in the process of bonding and in the physical structure of the lead without departing from the scope and spirit of the present invention. For instance, as indicated by the test arrangement in FIG. 4, the intervening conductive member 28 need not initially be part of the lead 29, to make use of the advantages of the present invention. The invention is, therefore, defined only by the scope of the appended claims.

What is claimed is:

1. In a method of bonding one end of a lead to a metallized bond site on a substrate, an improvement to minimize the occurrence of a failure resulting in separation of such lead from the bond site of the substrate at an interface between the lead and the metallization of the bond site in response to a force exerted on the lead in a direction perpendicular to the plane of the bond, the improvement comprising:

providing the lead with a folded end portion shorter than a main member of the lead;

positioning the end of the lead having the folded portion in contact with the respective bond site on the substrate, such that the folded portion at the end of the lead faces the bond site; and bonding the folded portion to the substrate, the folded portion being interposed between the main body of the lead and the bond site on the substrate being positioned to distribute and minimize concentrations of any bending stresses transmitted through the main body of the lead to the bonding site, wherein the step of bonding further comprises bonding the folded portion of the lead to the main body of the lead.

2. An electronic package, which comprises:

a substrate; and at least one lead member extending from the substrate, the lead member being joined to the substrate through an end portion of the member, the end portion being folded against a body portion of the member, the folded end portion being shorter than the body portion and interposed between the body portion and the substrate thus spacing the body portion of the member from the substrate, wherein the folded end portion is bonded to the substrate on one face thereof and to the body portion on an opposite face thereof.

3. An electronic package according to claim 2, wherein the bond between the body portion and the folded portion of the member and the bond between the folded portion of the member and the substrate are thermocompression bonds.

* * * * *